US009514791B2

(12) United States Patent
Patel et al.

(10) Patent No.: US 9,514,791 B2
(45) Date of Patent: Dec. 6, 2016

(54) FACILITATING COMMUNICATION BETWEEN MEMORY DEVICES OF DIFFERENT TECHNOLOGIES

(71) Applicant: Cisco Technology, Inc., San Jose, CA (US)

(72) Inventors: Viren Patel, Fremont, CA (US); Rajesh Edamula, Sunnyvale, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 14/506,842

(22) Filed: Oct. 6, 2014

(65) Prior Publication Data

US 2015/0026400 A1    Jan. 22, 2015

Related U.S. Application Data

(63) Continuation of application No. 12/783,671, filed on May 20, 2010, now Pat. No. 8,868,826.

(51) Int. Cl.
*G11C 7/10*    (2006.01)
*G06F 13/16*    (2006.01)
*G06F 13/38*    (2006.01)

(52) U.S. Cl.
CPC ......... *G11C 7/1072* (2013.01); *G06F 13/1694* (2013.01); *G06F 13/387* (2013.01)

(58) Field of Classification Search
CPC .. G06F 11/1092; G06F 13/387; G06F 3/0604; G06F 3/061; G06F 12/0638; G06F 2211/1057

USPC .......................................................... 711/162
See application file for complete search history.

(56) References Cited

U.S. PATENT DOCUMENTS

| 6,707,756 B2 | 3/2004 | Amidi |
| 2006/0047890 A1 | 3/2006 | Van De Waerdt |
| 2007/0058410 A1 | 3/2007 | Rajan |
| 2008/0082750 A1 | 4/2008 | Okin et al. |
| 2008/0133848 A1 | 6/2008 | Patel et al. |
| 2008/0144411 A1 | 6/2008 | Tsern |
| 2009/0235012 A1 | 9/2009 | Rosner et al. |

FOREIGN PATENT DOCUMENTS

WO    WO 2008/070576    6/2008

OTHER PUBLICATIONS

The Third Office Action from the State Intellectual Property Office of the People's Republic of China in Application No. 201010532198.X, dated May 11, 2015, 10 pages.
Communication Pursuant to Article 94(3) EPC from the European Patent Office in Application No. 10 189 324.6-1954, dated Apr. 29, 2015, 5 pages.

(Continued)

*Primary Examiner* — Mardochee Chery
(74) *Attorney, Agent, or Firm* — Baker Botts L.L.P.

(57) ABSTRACT

According to one embodiment, an apparatus comprises one or more memory devices and one or more processors coupled to a circuit board. The memory devices are configured according to a second memory technology. The processors are configured to receive messages conforming to a first memory technology, translate the messages from the first memory technology to the second memory technology, and send the translated messages to the memory devices.

14 Claims, 4 Drawing Sheets

(56) References Cited

OTHER PUBLICATIONS

The Patent Office of the Peoples Republic of China; The Second Office Action; Appln No. 200680055492.8; Serial No. 2012013100678540; 9 pages & translation; Feb. 3, 2012.
The Second Office Action from the State Intellectual Property Office of the Peoples Republic of China in Application No. 201010532198.X dated Mar. 7, 2014, 15 pages (transla).
Chinese Intellectual Property Office Office Action in Chinese Application No. 201010532198.X (with translation) dated Jun. 20, 2013, 31 pages.
Ryan J. Leng, fiThe Secrets of PC Memory: Part 2,fl Dennis Publishing Limited, hit-tech.net/hardware/memory/***/1, Dec. 17, 2007, 2 pages.
Communication from the European Patent Office with extended European Search Report in European Patent Application No. 10189324.6-2212/2418586, dated May 21, 2012, 7 pages.

FACILITATING COMMUNICATION BETWEEN MEMORY DEVICES OF DIFFERENT TECHNOLOGIES

RELATED APPLICATION

This application is a continuation of U.S. application Ser. No. 12/783,671 filed May 20, 2010 and entitled "Facilitating Communication Between Memory Devices and CPUs".

TECHNICAL FIELD

The present disclosure relates generally to memory devices.

BACKGROUND

A memory board includes memory devices that can store data. In certain situations, a central processing unit (CPU) board may store and retrieve information (such as data or instructions) from the memory devices of the memory board. In these situations, the CPU board and the memory board should be compatible to store and retrieve data.

DESCRIPTION OF EXAMPLE EMBODIMENTS

Overview

According to one embodiment, an apparatus comprises one or more memory devices and one or more processors coupled to a circuit board. The memory devices are configured according to a second memory technology. The processors are configured to receive messages conforming to a first memory technology, translate the messages from the first memory technology to the second memory technology, and send the translated messages to the memory devices.

Description

Figure 1:
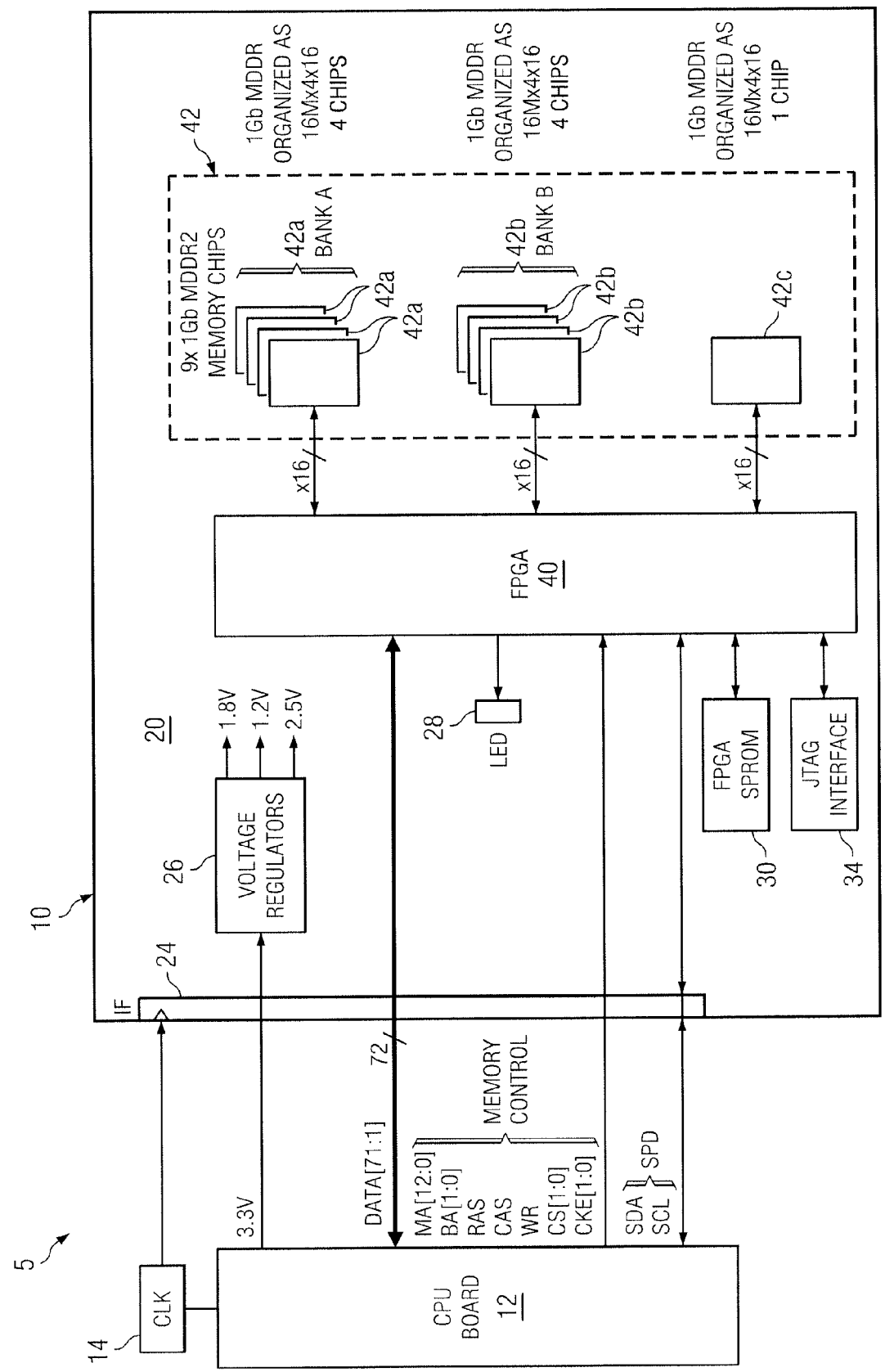
FIG. 1 illustrates a system that includes an example of an apparatus with memory devices that may be used to store data.

FIG. 1 illustrates a system 5 that includes an example of an apparatus 10 with memory devices that may be used to store data. In the illustrated example, apparatus 10 is coupled to a central processing unit (CPU) board 12 and a clock source 14 of system 5. In certain embodiments, CPU board 12 may be configured to communicate according to a first memory technology (a "CPU memory technology"). In certain embodiments, apparatus 10 comprises a circuit board 20 and one or more processors (such as one or more field programmable gate arrays (FPGAs)) 40 and one or more memory devices 42 coupled to circuit board 20. Memory devices 42 may be configured according to a second memory technology (a "memory device memory technology"). FPGA 40 may be configured to receive one or more messages conforming to the first memory technology, translate the messages from the first memory technology to the second memory technology, and provide the translated messages to the memory devices.

A memory technology may refer to features of a particular type of memory, such as dynamic random access memory (DRAM) or a static memory, for example, a synchronous static random access memory (SSRAM). Different memory technologies of different types of memory may have certain features that differ, while other features may be the same. Examples of features include data transfer rates, bandwidth, and clock frequency. Different memory technologies may be governed by different standards. For example, JEDEC Solid State Technology Association (formerly known as the Joint Electron Devices Engineering Council (JEDEC)) may have one standard for one memory technology and another standard for another memory technology.

In certain embodiments, the CPU memory technology may be an older (or newer) memory technology, and the memory device memory technology may be a newer (or older) memory technology. For example, the CPU memory technology may be single data rate synchronous dynamic random access memory (SDR SDRAM) memory technology, and the memory device memory technology may be double data rate synchronous dynamic random access memory (DDR SDRAM) memory technology.

System 5 may be implemented in any suitable environment. For example, system 5 may be implemented in a device such as communication switch. CPU board 12 may operate as a supervisor board of system 5, and apparatus 10 may store information, such as data or instructions, for CPU board 12. Any suitable signals may be communicated between CPU board 12 and apparatus 10. As an example, CPU board 12 may provide power to apparatus 10. As another example, CPU board 12 may store information at apparatus 10 and/or retrieve information from apparatus 10. As yet another example, CPU board 12 and apparatus 10 may communicate messages to each other. In some cases, CPU board 12 fetches instructions from apparatus 10. In some cases, CPU board 12 may send memory control messages to FPGA 40. In some cases, CPU board 12 and FPGA 40 may also communicate serial presence detect (SPD) messages (which may conform to the JEDEC standard) to each other. For example, the SPD value for the number of ranks may indicate whether apparatus 10 is working on a 512 MB or a 1 G mode. A number rank may be 2 in the 1 G mode and may be 1 in the 512 MB mode. As another example, the SPD value may indicate the memory technology used.

Clock source 14 may provide a common clock signal to CPU board and apparatus 10. The clock may have any suitable frequency, such as a frequency having a value in the range of less than 100, 100 to 500, or greater than 500 megahertz (MHz). The clock from the source to CPU 12 and the clock from source to apparatus 10 may be length matched to data bits and other control signals.

In the illustrated example, apparatus 10 includes a circuit board 20, an interface (IF) 24, one or more voltage regulators 26, a light emitting diode (LED) 28, a serial programmable read only memory (SPROM) 30, a Joint Test Action Group (JTAG) interface 34, a field programmable gate array (FPGA) 40, and one or more memory devices 42 coupled as shown. Memory devices 42 may be organized in any suitable manner. For example, at least a subset of memory devices 42 may be organized into one or more banks, where each bank comprises one or more memory devices 42. In the illustrated example, memory devices 42 are grouped into devices 42a, 42b, and 42c, where devices 42a form bank A and devices 42b form bank B and 42c performs error correcting code (ECC) operations for banks A and B.

In certain embodiments, circuit board 20 comprises any suitable substrate that is operable to support and couple components of apparatus 10. Circuit board 20 may comprise one or more pieces. In certain embodiments, interface 24 may communicate with another interface conforming to a memory technology that differs from that of apparatus 10. For example, interface 24 may communicate with an SDRAM interface of CPU board 12.

In certain embodiments, voltage regulator 26 may be used to power FPGA 40 and memory devices 42 and may convert input voltage into output voltages that may be used by components of apparatus 10. A regulator 26 may be used to translate the electrical interface voltage from the CPU memory technology to an electrical interface voltage supported by the memory device memory technology. For example, regulator 26 may provide voltages to convert an electrical interface of 3.3 volt (V) low-voltage transistor-to-transistor logic (LVTTL) to an electrical interface of 1.8 V low-voltage complementary metal oxide semiconductor (LVCMOS). In the illustrated example, voltage regulator 26 converts 3.3 volts to 1.8 volts, 1.2 volts, and 2.5 volts. In the example, memory devices 42 may use 1.8 volts, FPGA 40 may use 3.3 volts, 2.5 volts, 1.8 volts, and/or 1.2 volts, and SPROM 30 may use 3.3 volts.

In certain embodiments, LED 28 may be used to provide a debug indicator. In certain embodiments, LED 28 may blink to indicate the power supply is satisfactory, the module is out of reset mode, and/or the clock is running. In certain embodiments, SPROM 30 may be used to configure FPGA 40. In certain embodiments, SPROM 30 may store the image of FPGA 40.

A memory device 42 may comprise any suitable device configured to store data, such as a DDR SDRAM, for example a Mobile DDR SDRAM (MDDR SDRAM) or a small outline dual in-line memory module (SO-DIMM). Memory devices 42 may have any suitable speed grade (for example, a speed grade with a value in the range of less than 100, 100 to 200, or greater than 200 MHz) and have any suitable burst length (for example, a burst length of 2). Memory devices 42 may have any suitable memory capacity, for example, a capacity with a value in the range of less than 512 MB, 512 MB to 1 G, or greater than 1 G.

A memory device 42 may have any suitable specifications. In certain examples, a memory device 42 may have a bidirectional data strobe signal (DQS), differential clock inputs, an LVCMOS 1.8 volt compatible input, a DDR data bus, a burst length of 2, and/or programmable drive strengths. Data may be stored at memory devices 42 in any suitable manner. An example of a technique for storing data is described in more detail with reference to FIG. 3.

In certain embodiments, FPGA 40 may be configured to receive one or more messages conforming to the CPU memory technology, translate the messages from the CPU board technology to the memory device memory technology, and provide the translated messages to memory devices 42. FPGA 40 may translate any suitable messages, for example, memory commands, such as memory read, write, and/or refresh commands. In certain embodiments, CPU memory technology messages may be blocked and equivalent memory device memory technology messages may be issued. For example, in certain situations the initiation procedure and mode register command rights are different for the memory technologies. At start up of the board, FPGA 40 may block the CPU memory technology commands and then issue equivalent memory device memory technology commands.

FPGA 40 may translate between features that differ between CPU board 12 and apparatus 10. Examples of features that may differ include memory interface protocols, the number of address bits for columns, mode register fields, support for adjustment of drive strengths, minimum burst length, electrical interface voltage, or other feature. In certain embodiments, FPGA 40 may be configured to translate timing of the CPU memory technology to timing of the memory device memory technology. The cycles may be translated such that the read and/or write latency is the same as for the first memory technology. In certain embodiments, apparatus 10 may perform the translations with software transparency, that is, no software changes are required to perform the translations.

In certain embodiments, FPGA 40 may be configured to stripe data onto the one or more memory devices. Data striping involves segmenting logically sequential data, such as a single file. The segments may be assigned to different physical devices in a round-robin fashion. In certain embodiments, FPGA 40 may be configured to select a first memory device of the one or more memory devices to store first data and select a second memory device of the one or more memory devices to store second data. In certain other embodiments, FPGA 40 may embed redundancy into striping, which may yield higher reliability for data stored on apparatus 10.

In certain embodiments, FPGA 40 may be configured to implement a serial presence detect (SPD) feature. In certain embodiments, the SPD feature may identify the technology of memory devices 42 to CPU board 12, and inform CPU board 12 of timing to use to access memory devices 42.

Figure 2:
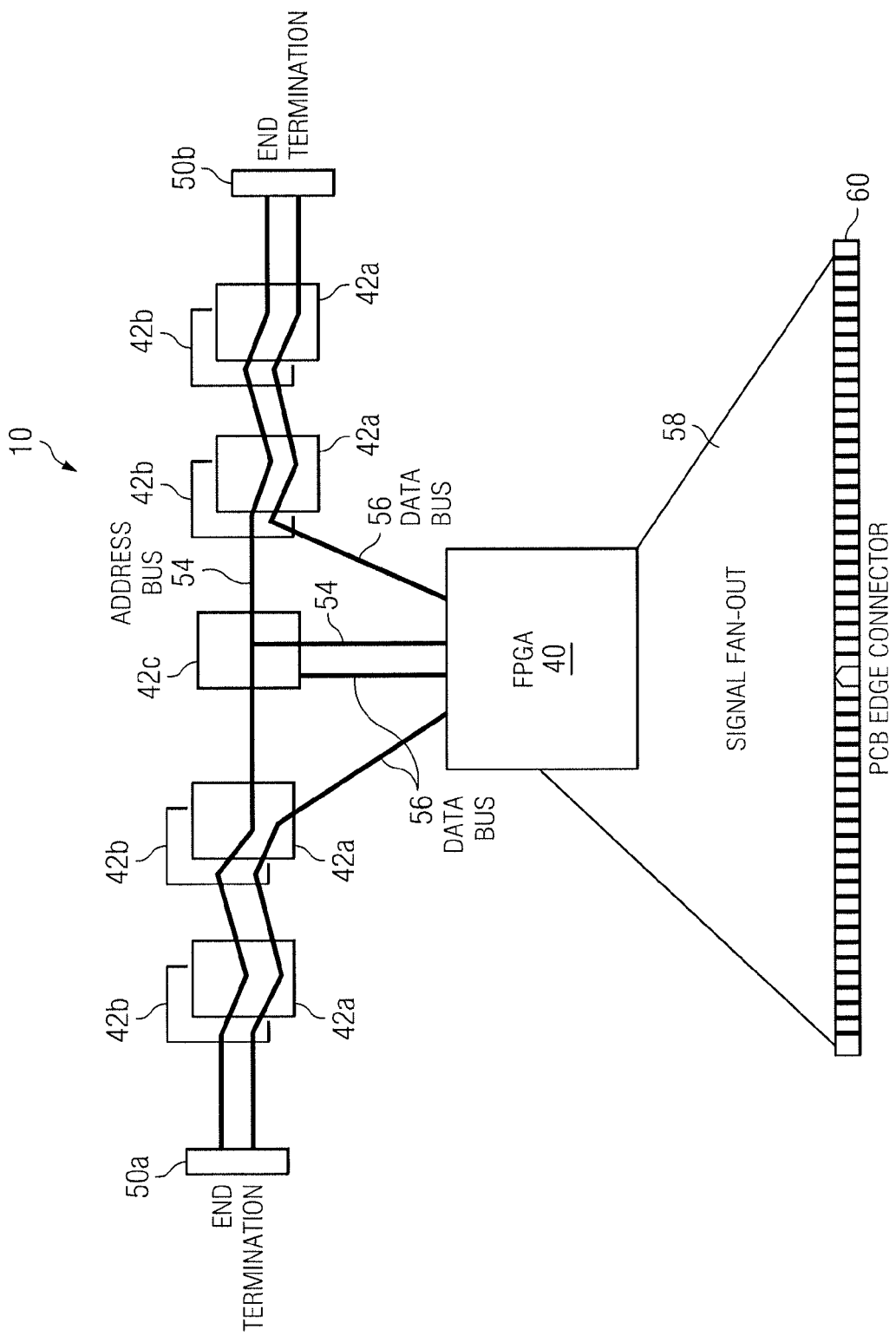
FIG. 2 illustrates an example of a layout that may be used for the apparatus of FIG. 1.

FIG. 2 illustrates an example of a layout that may be used for apparatus 10. In the example, apparatus 10 includes end terminations 50 (50*a*-*b*), memory devices 42*a*, 42*b*, and 42*c*, data busses 56 (56*a*-*d*), an addresses bus 54, FPGA 40, signal fan-out 58, and PCB edge connector 60 coupled as shown. A termination 50 may be an external bus termination. In certain embodiments, apparatus 10 may have external die terminations and no on-die terminations, which may reduce power. Address bus 54 specifies an address of a memory location for reading or writing. A data bus 56 transfers data. Fan-out 58 and edge connector 60 may have a pin-out that matches the pin-out of CPU 12. For example, the pin-out may given by the JEDEC Standard (JESD) 21-C specification for the SDRAM 144 pin SO-DIMM module. In certain embodiments, edge connector 60 may be located on CPU board 12.

Figure 3:
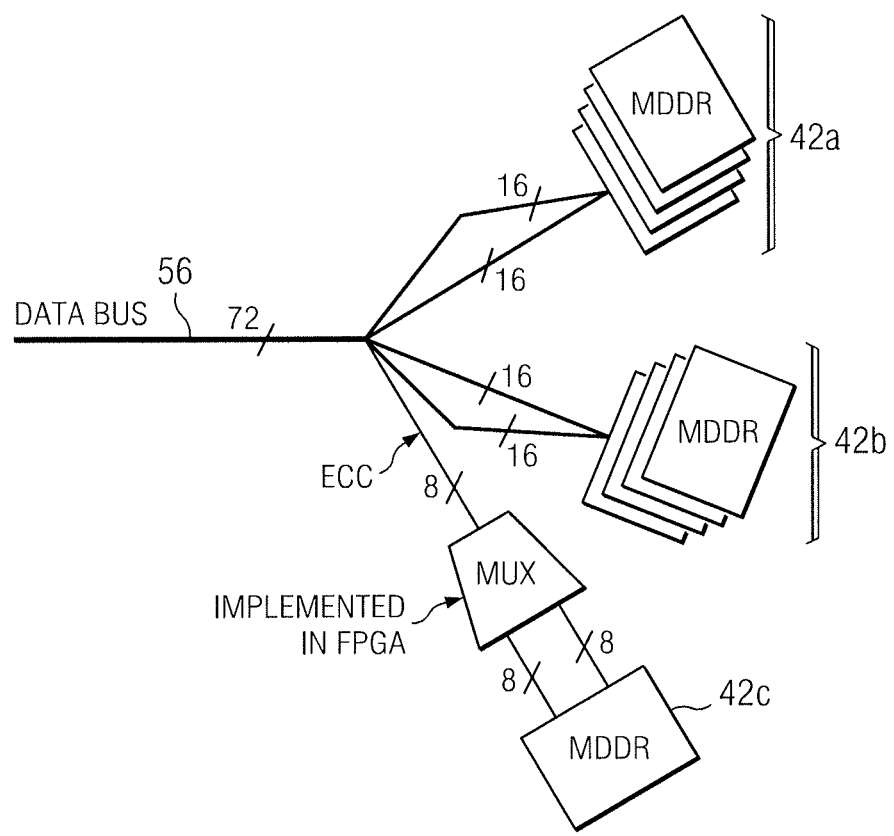
FIG. 3 illustrates an example data flow that may be used for the apparatus of FIG. 1.

FIG. 3 illustrates an example data flow that may be used for apparatus 10. memory devices 42 may have any suitable memory data width, for example, a width with a value in a range of 8 to 32 or greater than 32 bits. In the illustrated example, memory devices 42 may have a memory data width of 16 bits. The burst may be configured for any suitable cycle. In the illustrated example, the burst is configured at 2 (a two beat cycle) to push/pull 32 bit data at each access. Bits may be striped in any suitable manner. In the illustrated example, 32 bits of the most significant bits are striped to bank A 42*a*, and 32 bits of the least significant bits are striped to bank B 42*c*. Eight bits of error-correcting code (ECC) are striped to memory device 42*c*.

Figure 4:
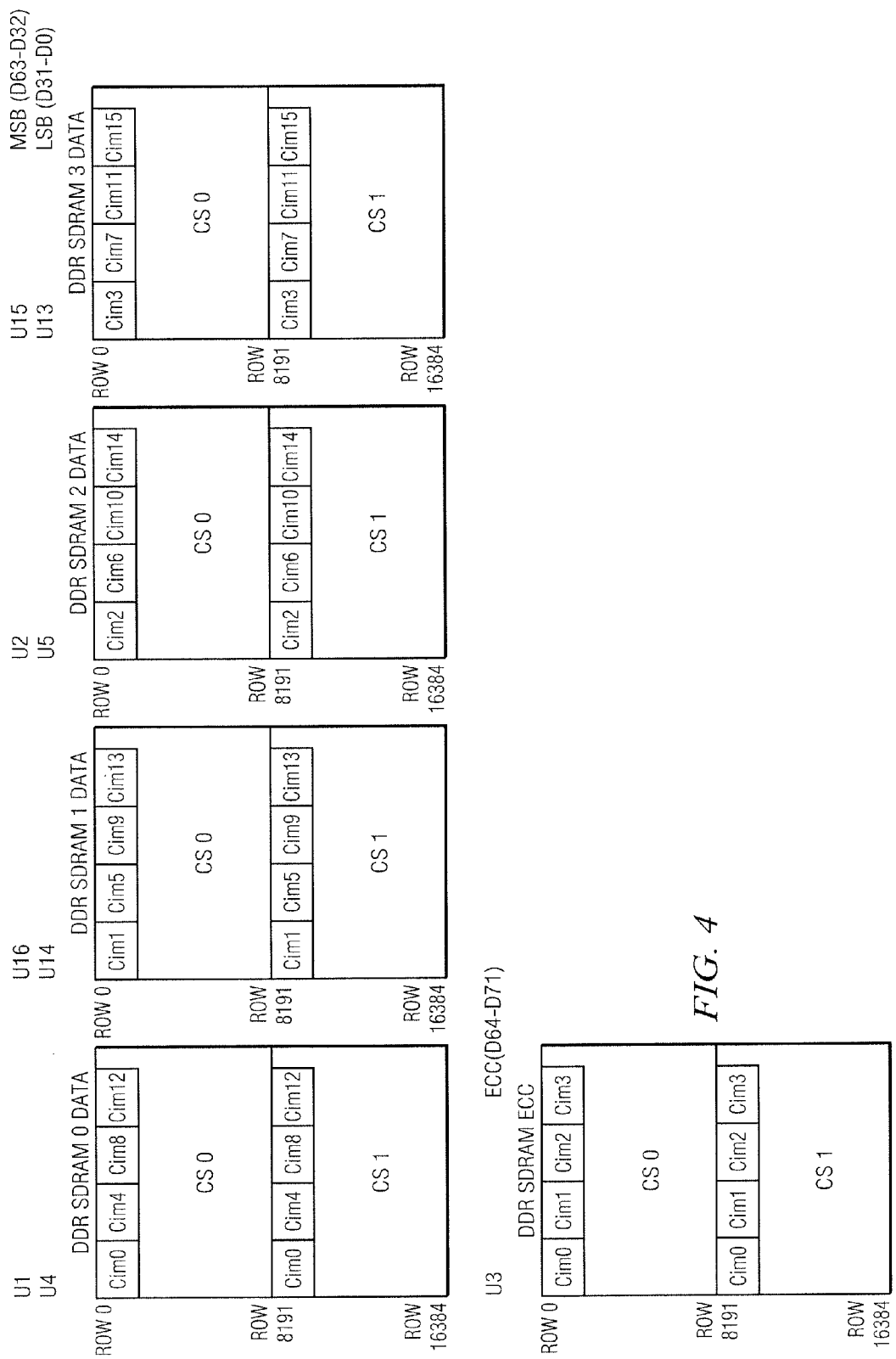
FIG. 4 illustrates an example of data striping that may be used with the apparatus of FIG. 1.

FIG. 4 illustrates an example of data striping that may be used with apparatus 10. Bits may be striped in any suitable manner. The illustrated example shows one of two sets of busses. CS0 and CS1 are SDRAM side chip selects. In the illustrated example, SDRAM side D0-D31 stripes to memory devices U4, U14, U5, U13. SDRAM side D32-D63 stripes to MDDR memory devices U1, U16, U2, U15. SDRAM side D64-D71 stripes to MDDR memory device U3.

Modifications, additions, or omissions may be made to the systems and apparatuses disclosed herein without departing from the scope of the invention. The components of the systems and apparatuses may be integrated or separated. For example, the components of apparatus 10 may be located on one or more boards 20. Moreover, the operations of the systems and apparatuses may be performed by more, fewer, or other components. For example, the operations of a memory device 40 and SPROM 30 may be performed by one component, or the operations of FPGA 40 may be performed by more than one component. Additionally, operations of the systems and apparatuses may be performed using any suitable logic comprising software, hardware, and/or other logic. As used in this document, "each" refers to each member of a set or each member of a subset of a set.

Modifications, additions, or omissions may be made to the methods disclosed herein without departing from the scope of the invention. The methods may include more, fewer, or other steps. Additionally, steps may be performed in any suitable order.

A component of the systems and apparatuses disclosed herein may include an interface, logic, memory, and/or other suitable element. An interface receives input, sends output, processes the input and/or output, and/or performs other suitable operation. An interface may comprise hardware and/or software.

Logic performs the operations of the component, for example, executes instructions to generate output from input. Logic may include hardware, software, and/or other logic. Logic may be encoded in one or more tangible media and may perform operations when executed by a computer. Certain logic, such as a processor, may manage the operation of a component. Examples of a processor include one or more computers, one or more microprocessors, one or more applications, and/or other logic.

In particular embodiments, the operations of the embodiments may be performed by one or more computer readable media encoded with a computer program, software, computer executable instructions, and/or instructions capable of being executed by a computer. In particular embodiments, the operations of the embodiments may be performed by one or more computer readable media storing, embodied with, and/or encoded with a computer program and/or having a stored and/or an encoded computer program.

A memory stores information. A memory may comprise one or more non-transitory, tangible, computer-readable, and/or computer-executable storage media. Examples of memory include computer memory (for example, Random Access Memory (RAM) or Read Only Memory (ROM)), mass storage media (for example, a hard disk), removable storage media (for example, a Compact Disk (CD) or a Digital Video Disk (DVD)), database and/or network storage (for example, a server), and/or other computer-readable medium.

Components of the systems and apparatuses disclosed herein may be coupled by any suitable communication network. A communication network may comprise all or a portion of one or more of the following: a public switched telephone network (PSTN), a public or private data network, a local area network (LAN), a metropolitan area network (MAN), a wide area network (WAN), a local, regional, or global communication or computer network such as the Internet, a wireline or wireless network, an enterprise intranet, other suitable communication link, or any combination of any of the preceding.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the following claims.

What is claimed is:

1. An apparatus, comprising:
   a processor coupled to the circuit board, the processor configured to receive one or more messages conforming to a first memory technology;
   one or more memory devices coupled to a circuit board and the processor, the one or more memory devices configured according to a second memory technology; and
   the processor further configured to:
      translate the one or more messages from the first memory technology to the second memory technology;
      adjust one or more features associated with the one or more memory devices to conform to one or more features associated with the first memory technology, wherein a feature of the one or more features associated with the one or more memory devices comprises a drive strength of the one or more memory devices;
      stripe the translated one or more messages into first data and second data, wherein redundancy of the translated one or more messages is embedded into the striping;
      select a first memory device of the one or more memory devices to store the first data, wherein the first data comprises most significant bits of data;
      select a second memory device of the one or more memory devices to store the second data, wherein the second data comprises least significant bits of data;
      send the first data to the first memory device; and
      send the second data to the second memory device.

2. The apparatus of claim 1, wherein:
   the first memory technology comprises single data rate synchronous dynamic random access memory; and
   the second memory technology comprises mobile double data rate synchronous dynamic random access memory.

3. The apparatus of claim 1, wherein the translations are performed with software transparency.

4. The apparatus of claim 1, the processor further configured to communicate a serial presence detect message indicating a rank of the one or more memory devices, the rank of the one or more memory devices corresponding to a memory capacity associated with the one or more memory devices.

5. The apparatus of claim 1, wherein adjusting features associated with the one or more memory devices further comprises adjusting at least one of the following:
   a burst length associated with the one or more memory devices;
   an electrical interface voltage of the one or more memory devices; and
   a read/write latency associated with the one or more memory devices.

6. A method, comprising:
receiving, by a processor, one or more messages conforming to a first memory technology;
translating, by the processor, the one or more messages from the first memory technology to a second memory technology;
adjusting, by the processor, one or more features associated with one or more memory devices to conform to one or more features associated with the first memory technology, the one or more memory devices configured according to the second memory technology, and a feature of the one or more features associated with the one or more memory devices comprises a drive strength of the one or more memory devices;
striping, by the processor, the translated one or more messages into first data and second data, wherein redundancy of the translated one or more messages is embedded into the striping;
selecting, by the processor, a first memory device of the one or more memory devices to store the first data, wherein the first data comprises most significant bits of data;
selecting, by the processor, a second memory device of the one or more memory devices to store the second data, wherein the second data comprises least significant bits of data;
sending the first data to the first memory device; and
sending the second data to the second memory device.

7. The method of claim 6, wherein:
the first memory technology comprises single data rate synchronous dynamic random access memory; and
the second memory technology comprises mobile double data rate synchronous dynamic random access memory.

8. The method of claim 6, wherein the translations are performed with software transparency.

9. The method of claim 6, further comprises communicating a serial presence detect message indicating a rank of the one or more memory devices, the rank of the one or more memory devices corresponding to a memory capacity associated with the one or more memory devices.

10. The method of claim 6, wherein adjusting features associated with the one or more memory devices further comprises adjusting at least one of the following:
a burst length associated with the one or more memory devices;
an electrical interface voltage of the one or more memory devices; and
a read/write latency associated with the one or more memory devices.

11. One or more non-transitory computer readable media when executed by a computer are configured to:
receive one or more messages conforming to a first memory technology;
translate the one or more messages from the first memory technology to a second memory technology;
adjust one or more features associated with one or more memory devices to conform to one or more features associated with the first memory technology, the one or more memory devices configured according to the second memory technology;
stripe the translated one or more messages into first data and second data, wherein redundancy of the translated one or more messages is embedded into the striping;
select a first memory device of the one or more memory devices to store the first data, wherein the first data comprises most significant bits of data;
select a second memory device of the one or more memory devices to store the second data, wherein the second data comprises least significant bits of data;
send the first data to the first memory device; and
send the second data to the second memory device.

12. The media of claim 11, wherein:
the first memory technology comprises single data rate synchronous dynamic random access memory; and
the second memory technology comprises mobile double data rate synchronous dynamic random access memory.

13. The media of claim 11, wherein the translations are performed with software transparency.

14. The media of claim 11, wherein adjusting features associated with the one or more memory devices further comprises adjusting at least one of the following:
a burst length associated with the one or more memory devices;
an electrical interface voltage of the one or more memory devices; and
a read/write latency associated with the one or more memory devices.

* * * * *